United States Patent
Ishioka et al.

(10) Patent No.: US 11,937,365 B2
(45) Date of Patent: Mar. 19, 2024

(54) AFFIXATION FILM FOR PRINTED WIRING BOARD

(71) Applicant: Tatsuta Electric Wire & Cable Co., Ltd., Higashiosaka (JP)

(72) Inventors: Sougo Ishioka, Kizugawa (JP); Masahiro Watanabe, Kizugawa (JP)

(73) Assignee: Tatsuta Electric Wire & Cable Co., Ltd., Higashiosaka (JP)

( * ) Notice: Subject to any disclaimer, the term of this patent is extended or adjusted under 35 U.S.C. 154(b) by 651 days.

(21) Appl. No.: 17/256,931

(22) PCT Filed: Jul. 5, 2019

(86) PCT No.: PCT/JP2019/026844
§ 371 (c)(1),
(2) Date: Apr. 14, 2021

(87) PCT Pub. No.: WO2020/009230
PCT Pub. Date: Jan. 9, 2020

(65) Prior Publication Data
US 2021/0289615 A1 Sep. 16, 2021

(30) Foreign Application Priority Data
Jul. 6, 2018 (JP) .................. 2018-129321

(51) Int. Cl.
*H05K 1/02* (2006.01)
*H05K 9/00* (2006.01)

(52) U.S. Cl.
CPC .......... *H05K 1/023* (2013.01); *H05K 9/0088* (2013.01); *H05K 2201/0715* (2013.01)

(58) Field of Classification Search
CPC .... H05K 1/023; H05K 1/0231; H05K 1/0233; H05K 1/0234
See application file for complete search history.

(56) References Cited

U.S. PATENT DOCUMENTS

2018/0288884 A1* 10/2018 Ori .................. C23C 18/1651

FOREIGN PATENT DOCUMENTS

| JP | 2014078574 A | 5/2014 |
|---|---|---|
| JP | 2014112576 A | 6/2014 |
| JP | 2014185247 A | 10/2014 |
| JP | 2015052025 A | 3/2015 |
| JP | 2015083379 A | 4/2015 |
| JP | 2018069459 A | 5/2018 |
| JP | 6426865 B1 | 11/2018 |

OTHER PUBLICATIONS

International Search Report dated Sep. 11, 2019, issued in International Application No. PCT/JP2019/026844.

* cited by examiner

*Primary Examiner* — Jeremy C Norris
(74) *Attorney, Agent, or Firm* — United IP Counselors, LLC; Kenneth M. Fagin

(57) ABSTRACT

An affixation film 101 for a printed wiring board includes a circuit pattern concealing layer 112, and an adhesive layer 111 put on top of the circuit pattern concealing layer 112. An opposite surface of the circuit pattern concealing layer 112 from the adhesive layer 111 has an Rku of 2.5-3.0.

7 Claims, 3 Drawing Sheets

AFFIXATION FILM FOR PRINTED WIRING BOARD

TECHNICAL FIELD

The present disclosure relates to affixation films for a printed wiring board and electromagnetic wave shielding films.

BACKGROUND ART

As electronic devices have become more and more complicated, printed wiring boards also have had a more and more complicated circuit pattern. The design of a circuit pattern has had a more and more significant influence on the performance of an electronic device, and therefore, circuit patterns are now important information that should be protected. Therefore, it has been proposed that a colored film such as a coverlay film is affixed to the surface of a printed wiring board in an attempt to prevent the circuit pattern of the printed wiring board from being directly visually recognized (see, for example, PATENT DOCUMENT 1).

CITATION LIST

Patent Document

PATENT DOCUMENT 1: Japanese Unexamined Patent Publication No. 2014-185247

SUMMARY OF THE INVENTION

Technical Problem

However, on the surface of a printed wiring board, there are height differences or steps that are attributed to the circuit pattern. Therefore, even when a black-colored film is affixed to a printed wiring board, the circuit pattern may stand out in the film surface due to light reflection or the like, and therefore, sufficient concealment may not be achieved. Under such circumstances, there is a demand for a film that provides further improved concealment.

The present disclosure describes an affixation film that provides a higher level of concealment for circuit patterns.

Solution to the Problem

An affixation film for a printed wiring board according to a first embodiment of the present disclosure includes a circuit pattern concealing layer, and an adhesive layer put on top of the circuit pattern concealing layer. An opposite surface of the circuit pattern concealing layer from the adhesive layer has an Rku of 2.5-3.0.

In the affixation film of the first embodiment, the opposite surface of the circuit pattern concealing layer from the adhesive layer may have a relative load length ratio (Rmr) of 5.3-8.5%, where a cut level is 20%.

An affixation film for a printed wiring board according to a second embodiment of the present disclosure includes a circuit pattern concealing layer, and an adhesive layer put on top of the circuit pattern concealing layer. An opposite surface of the circuit pattern concealing layer from the adhesive layer has an Sku of 1.8-4.0.

In the affixation film of the second embodiment, the opposite surface of the circuit pattern concealing layer from the adhesive layer may have a core material volume (Vmc) of 2.0-3.0 mL/m$^2$, where an areal material ratio at which protruding hills are separated from a core is 10%, and an areal material ratio at which protruding dales are separated from a core is 80%.

An electromagnetic wave shielding film according to an embodiment of the present disclosure includes the affixation film of the present disclosure. The adhesive layer is a conductive adhesive layer.

The electromagnetic wave shielding film of the embodiment may further include a shielding layer between the circuit pattern concealing layer and the adhesive layer.

Advantages of the Invention

The printed wiring board affixation film of the present disclosure can provide improved concealment of a circuit pattern.

DESCRIPTION OF EMBODIMENTS

A printed wiring board affixation film 101 (also hereinafter simply referred to as an "affixation film") according to this embodiment includes a circuit pattern concealing layer 112 (also hereinafter simply referred to as a "concealing layer"), and an adhesive layer 111 that is formed on one side of the concealing layer 112.

Figure 1:
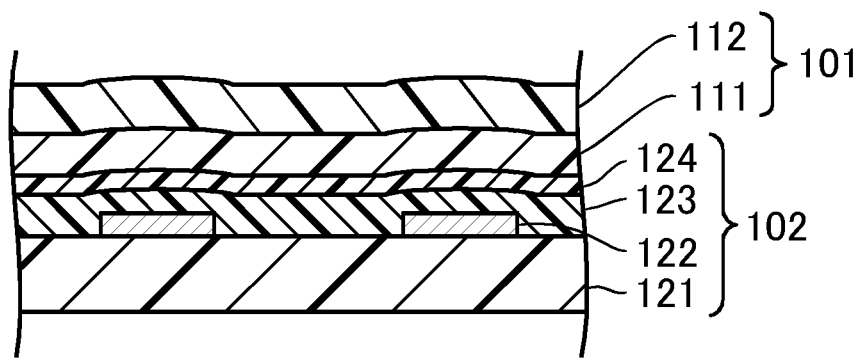
FIG. 1 is a cross-sectional view showing a printed wiring board to which an affixation film for a printed wiring board according to an embodiment is affixed.

As shown in FIG. 1, the affixation film 101 of this embodiment is capable of being affixed to a printed wiring board 102. The printed wiring board 102 has, for example, a base layer 121, and a circuit pattern 122 provided on a surface of the base layer 121. The circuit pattern 122 is, for example, covered by an insulating adhesive layer 123 and an insulating film 124.

The base layer 121 is made of an insulating material. As the insulating material, insulating resin compositions, ceramics, etc., can be used. As the insulating resin composition, at least one can be used which is selected from the group consisting of polyimide resins, polyamideimide resins, polyamide resins, polyetherimide resins, polyesterimide resins, polyether nitrile resins, polyether sulfone resins, polyphenylene sulfide resins, polyethylene terephthalate resins, polypropylene resins, crosslinked polyethylene resins, polyester resins, polybenzimidazole resins, polyimide resins, polyimideamide resins, polyetherimide resins, and polyphenylene sulfide resins.

The circuit pattern 122 is made of a conductive material. As the conductive material, metal foil, or a conductive material obtained by printing and curing a mixture of a conductive filler and a resin composition, can be used. Copper foil is preferably used in terms of cost.

The thickness of the circuit pattern 122 is not particularly limited, and is preferably 1-100 μm, more preferably 1-50 μm. If the thickness of the circuit pattern is 1 μm or more, the manufacturing cost of the printed wiring board 102 can be reduced. If the thickness of the circuit pattern is 100 μm or less, the thickness of the printed wiring board 102 can be reduced.

The adhesive layer 123 is made of an insulating material. As the insulating material, an insulating resin composition is preferable, and for example, at least one can be used which is selected from the group consisting of polyimide resins, polyamideimide resins, polyamide resins, polyetherimide resins, polyesterimide resins, polyether nitrile resins, polyether sulfone resins, polyphenylene sulfide resins, polyethylene terephthalate resins, polypropylene resins, cross-linked polyethylene resins, polyester resins, and polybenzimidazole resins.

The thickness of the adhesive layer 123 is not particularly limited, and is preferably 1-50 μm.

The insulating film 124 is made of an insulating material. As the insulating material, an insulating resin composition is preferable, and for example, at least one can be used which is selected from the group consisting of polyimide resins, polyamideimide resins, polyamide resins, polyetherimide resins, polyesterimide resins, polyether nitrile resins, polyether sulfone resins, polyphenylene sulfide resins, polyethylene terephthalate resins, polypropylene resins, cross-linked polyethylene resins, polyester resins, and polybenzimidazole resins.

The thickness of the insulating film 124 is not particularly limited, and is preferably 1-100 μm, more preferably 10-25 μm. If the thickness is 1 μm or more, the manufacturing cost of the printed wiring board can be reduced. If the thickness is 100 μm or less, the thickness of the printed wiring board can be reduced.

If the concealing layer 112 is colored so that the affixation film 101 is not transparent, the circuit pattern 122 cannot be directly visually recognized. For example, if the circuit pattern 122 is preferably covered by a film having a total luminous transmittance of 20% or less, more preferably 10% or less, and even more preferably 5% or less, it is substantially impossible to directly visually recognize the circuit pattern 122. However, due to the circuit pattern 122, protrusions and recesses are formed on the surface of the concealing layer 112. The circuit pattern 122 is typically formed by copper lines whose heights are from several micrometers to less than 20 micrometers. The difference in height between a portion where a line is present and a portion where a line is not present is reduced due to embedding of the adhesive layer 123 or the like, and therefore, the heights of the protrusions and recesses occurring on the surface of the concealing layer 112 are several micrometers. However, if the surface tends to reflect light, the presence of such small protrusions and recesses can be visually recognized, and therefore, the circuit pattern 122 fails to be concealed.

In order to improve the concealment, minute irregularities may be formed at the surface of the concealing layer 112 so as to reduce light reflection on the concealing layer 112. However, the present inventors have found that the concealment of a circuit pattern does not correlate with an arithmetic mean roughness (Ra) as defined in Japanese Industrial Standards (JIS) B0601: 2001, a three-dimensional arithmetic average height (Sa) as defined in the International Organization for Standardization (ISO) 25178, or the like, which are a commonly used index of surface roughness. Meanwhile, the present inventors have found that the concealment can be improved if the surface of the concealing layer 112 has a kurtosis (Rku) as defined in JIS B0601: 2001 and a kurtosis (Sku) as defined in ISO 25178 in respective predetermined ranges.

Specifically, the opposite side (surface) of the concealing layer 112 from the adhesive layer 111 has an Rku of 2.5 or more, preferably 2.6 or more, and more preferably 2.7 or more, and 3.0 or less, preferably 2.9 or less. The surface of the concealing layer 112 also has an Sku of 1.8 or more, preferably 1.9 or more, and more preferably 2.1 or more, and 4.0 or less, preferably 3.0 or less, and more preferably 2.5 or less. If at least one of the Rku and the Sku has such a value, the concealment of the circuit pattern 122 by the affixation film 101 can be improved.

The surface of the concealing layer 112 preferably has a relative load length ratio (Rmr), at a cut level of 20%, of 5.3% or more, more preferably 5.4% or more, and even more preferably 5.5% or more, and preferably 8.5% or less, more preferably 8.0% or less, even more preferably 7.8% or less, still even more preferably 7.0% or less, and still even more preferably 6.0% or less. If the Rmr has such a value in addition to the above Rku, the concealment can be further improved.

For the surface of the concealing layer 112, in the case where the areal material ratio at which the protruding hills are separated from the core is 10%, and the areal material ratio at which the protruding dales are separated from the core is 80%, the core material volume (Vmc) can be preferably 1.8 mL/m$^2$ or more, more preferably 2.0 mL/m$^2$ or more, and even more preferably 2.2 mL/m$^2$ or more, and preferably 3.0 mL/m$^2$ or less. If the Vmc has such a value in addition to the above Sku, the concealment can be further improved.

As shown in examples below, the Rku and the Rmr can be measured using a technique as specified in JIS B0601: 2001. As shown in examples below, the Sku and the Vmc can be measured using a technique as specified in ISO 25178.

The concealing layer 112 can be formed of a metal, thermoplastic resin, thermosetting resin, actinic ray curable resin, or the like. As the metal, one of nickel, copper, silver, tin, gold, palladium, aluminum, chromium, titanium, zinc, etc., or an alloy containing two or more thereof, can be used. As the thermoplastic resin, which is not particularly limited, styrene-based resins, vinyl acetate resins, polyester resins, polyethylene resins, polypropylene resins, imide resins, acrylic resins, etc., can be used. As the thermosetting resin, which is not particularly limited, phenolic resins, epoxy resins, isocyanate group-terminated urethane resins, isocyanate group-terminated urea resins, isocyanate group-terminated urethane urea resins, melamine resins, alkyd resins, etc., can be used. As the actinic ray curable resin, which is not particularly limited, for example, a polymerizable compound having at least two (meth)acryloyloxy groups per molecule can be used. These resins may be used alone or in combination.

By applying any of the abovementioned resins to a surface of a releasable base having irregularities produced by embossing or the like, and then drying the resin, the concealing layer 112 having a predetermined surface texture can be formed. The releasable base may be a film on a surface of which a matte layer having irregularities is provided instead of embossing. The matte layer can be formed by applying a resin composition containing fine particles to the film surface, or embossing the surface of a resin layer formed on the film surface.

Instead of using a releasable base having irregularities, the concealing layer 112 having a predetermined surface texture can be formed by, for example, blowing dry ice or the like to or pressing a mold having irregularities against the surface of a resin layer made of any of the abovementioned resins.

Fine particles may be added to the concealing layer 112 in order to adjust the surface texture of the concealing layer 112. As the fine particles added to the concealing layer 112, which are not particularly limited, for example, fine resin particles or fine inorganic particles may be used. Examples of the fine resin particles include fine acrylic resin particles, fine polyacrylonitrile particles, fine polyurethane particles, fine polyamide particles, and fine polyimide particles. Examples of the inorganic fine particles include fine calcium carbonate particle, fine calcium silicate particles, clay, kaolinite, talc, fine silica particles, fine glass particles, diatomaceous earth, mica powder, fine alumina particles, fine magnesium oxide particles, fine zinc oxide particles, fine barium sulfate particle, fine aluminum sulfate particles, fine calcium sulfate particles, and fine magnesium carbonate particles. These fine resin particles and these fine inorganic particles may be used alone or in combination.

The concealing layer 112 preferably has a total luminous transmittance of 20% or less, more preferably 10% or less, and even more preferably 5% or less. If the total luminous transmittance is 20% or less, then when the affixation film 101 is affixed to the printed wiring board 102, the circuit pattern 122 is less likely to be directly visually recognized.

In order to reduce light reflection of the concealing layer 112, a black coloring agent is preferably added to the concealing layer 112. The black coloring agent may, for example, be a black pigment, or a mixed pigment having a black color obtained by subtractive mixing of a plurality of pigments. The black pigment may be one or a combination of, for example, carbon black, Ketjen black, carbon nanotubes (CNTs), perylene black, titanium black, iron black, aniline black, etc. The mixed pigment may be obtained by mixing, for example, red, green, blue, yellow, violet, cyan, magenta pigments, etc. The added amount of the black coloring agent is preferably 0.5 mass % or more, more preferably 1 mass % or more, with respect to 100 parts by mass of the resin, in order to reduce light reflection.

The concealing layer 112 may optionally contain at least one of curing accelerators, tackifiers, antioxidants, pigments, dyes, plasticizers, UV absorbents, defoamers, leveling agents, fillers, flame retardants, viscosity modifiers, antiblocking agents, etc.

The thickness of the concealing layer 112 is not particularly limited, and can be suitably set when necessary. In order to achieve concealment, facilitate formation, and ensure flexibility, etc., the thickness of the concealing layer 112 is preferably 1 μm or more, more preferably 4 μm or more, and preferably 20 μm or less, more preferably 10 μm or less, and even more preferably 5 μm or less.

In this embodiment, the adhesive layer 111 can be formed of at least one of thermoplastic resins, thermosetting resins, actinic ray curable resin, etc.

Examples of the thermoplastic resin that may be contained in the adhesive layer 111 include styrene-based resins, vinyl acetate resins, polyester resins, polyethylene resins, polypropylene resins, imide resins, and acrylic resins. These resins may be used alone or in combination.

Examples of the thermosetting resin that may be contained in the adhesive layer 111 include phenolic resins, epoxy resins, urethane resins, melamine resins, polyamide resins, and alkyd resins. As the actinic ray curable resin, which is not particularly limited, for example, a polymerizable compound having at least two (meth)acryloyloxy group per molecule can be used. These resins may be used alone or in combination.

The thermosetting resin contains, for example, a first resin component that has a first functional group which is reactive, and a second resin component that has a second functional group which reacts with the first functional group. The first functional group may, for example, be an epoxy group, amide group, hydroxy group, or the like. The second functional group is selected, depending on the first functional group, and, for example, in the case where the first functional group is an epoxy group, the second functional group may be a hydroxy group, carboxyl group, epoxy group, amino group, or the like. Specifically, for example, in the case where the first resin component is an epoxy resin, the second resin component may be an epoxy group-modified polyester resin, epoxy group-modified polyamide resin, epoxy group-modified acrylic resin, epoxy group-modified polyurethane polyurea resin, carboxyl group-modified polyester resin, carboxyl group-modified polyamide resin, carboxyl group-modified acrylic resin, carboxyl group-modified polyurethane polyurea resin, urethane-modified polyester resin, or the like. Of them, preferable are a carboxyl group-modified polyester resin, carboxyl group-modified polyamide resin, carboxyl group-modified polyurethane polyurea resin, and urethane-modified polyester resin. In the case where the first resin component has a hydroxy group, the second resin component may be an epoxy group-modified polyester resin, epoxy group-modified polyamide resin, epoxy group-modified acrylic resin, epoxy group-modified polyurethane polyurea resin, carboxyl group-modified polyester resin, carboxyl group-modified polyamide resin, carboxyl group-modified acrylic resin, carboxyl group-modified polyurethane polyurea resin, urethane-modified polyester resin, or the like. Of them, preferable are a carboxyl group-modified polyester resin, carboxyl group-modified polyamide resin, carboxyl group-modified polyurethane polyurea resin, and urethane-modified polyester resin.

The thermosetting resin may contain a curing agent that accelerates a thermosetting reaction. In the case where the thermosetting resin has a first functional group and a second functional group, the curing agent may be suitably selected, depending on the first and second functional groups. In the case where the first functional group is an epoxy group and the second functional group is a hydroxy group, imidazole curing agents, phenolic curing agents, cationic curing agents, etc., may be used. These may be used alone or in combination. As any other optional components, a defoamer, antioxidant, viscosity modifier, diluent, anti-sedimentation agent, leveling agent, coupling agent, coloring agent, flame retardant, etc., may be contained.

The thickness of the adhesive layer 111 is not particularly limited, and is preferably 1-50 μm in order to ensure adhesiveness and flexibility, etc.

The adhesive layer 111 may have tackiness, or so-called adhesiveness, in an environment having room temperature (e.g., 20° C.). As the adhesive layer 111 has tackiness in an environment having room temperature, the affixation film 101 for a printed wiring board can be easily affixed to any suitable position of the printed wiring board 102.

A conductive filler may be added to the adhesive layer 111 to make the adhesive layer 111 conductive, i.e., to provide a conductive adhesive layer. In the case where the adhesive layer 111 is conductive and the concealing layer 112 is an insulating protection layer, the affixation film 101 can be used as an electromagnetic wave shielding film. In the case where the affixation film 101 is used as an electromagnetic wave shielding film, the conductive adhesive layer 111 is coupled to a ground pattern provided on the printed wiring board 102.

The conductive filler is not particularly limited, and may, for example, be a metal filler, metal-covered resin filler, carbon filler, or a mixture thereof. Examples of the metal filler include copper powder, silver powder, nickel powder, silver-coated copper powder, gold-coated copper powder, silver-coated nickel powder, and gold-coated nickel powder. These metal powders can be produced by electrolysis, atomization, reduction, or the like. Of them, one of silver powder, silver-coated copper powder, and copper powder is preferable.

The conductive filler preferably has an average particle size of 1 μm or more, more preferably 3 μm or more, and preferably 50 μm or less, more preferably 40 μm or less, in terms of contact between filler particles. The shape of the conductive filler is not particularly limited, and may be spherical, flake-shaped, dendrite-shaped, fibrous, or the like.

The contained amount of the conductive filler is suitably selected, depending on the application. The contained amount of the conductive filler in the total solid content is preferably 5 mass % or more, more preferably 10 mass % or more, and preferably 95 mass % or less, more preferably 90 mass % or less. The contained amount of the conductive filler is preferably 70 mass % or less, more preferably 60 mass % or less, in terms of embedding properties. In order to achieve anisotropic conductivity, the contained amount of the conductive filler is preferably 40 mass % or less, more preferably 35 mass % or less.

Figure 2:
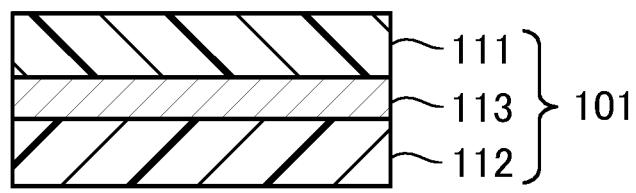
FIG. 2 is a cross-sectional view showing a variation of the affixation film for a printed wiring board.

In the case where the affixation film 101 is used as an electromagnetic wave shielding film, as shown in FIG. 2 a shielding layer 113 may be provided between the concealing layer 112 and the adhesive layer 111. The shielding layer 113 may be formed of a metal foil, evaporated film, conductive filler, or the like.

The metal foil is not particularly limited, and may be a foil of one of nickel, copper, silver, tin, gold, palladium, aluminum, chromium, titanium, zinc, etc., or an alloy containing two or more thereof.

The thickness of the metal foil is not particularly limited, and is preferably 0.5 μm or more, more preferably 1.0 μm or more. If the thickness of the metal foil is 0.5 μm or more, then when a high-frequency signal of from 10 MHz to 100 GHz is transmitted in the shielded printed wiring board, the attenuation of the high-frequency signal can be reduced. The thickness of the metal foil is also preferably 12 μm or less, more preferably 10 μm or less, and even more preferably 7 μm or less. If the thickness of the metal foil is 12 μm or less, a good elongation at break can be ensured.

The evaporated film is not particularly limited, and may be formed by evaporation of nickel, copper, silver, tin, gold, palladium, aluminum, chromium, titanium, zinc, or the like. The evaporation can be performed by electroplating, electroless plating, sputtering, electron-beam evaporation, vacuum evaporation, chemical vapor deposition (CVD), metal organic chemical vapor deposition, or the like.

The thickness of the evaporated film is not particularly limited, and is preferably 0.05 μm or more, more preferably 0.1 μm or more. If the thickness of the evaporated film is 0.05 μm or more, the electromagnetic wave shielding film has excellent electromagnetic wave shielding performance in the shielded printed wiring board. The thickness of the evaporated film is preferably less than 0.5 more preferably less than 0.3 If the thickness of the evaporated film is less than 0.5 the electromagnetic wave shielding film has excellent bending resistance, and therefore, damage to the shielding layer due to height differences or steps occurring on the printed wiring board can be prevented or reduced.

In the case where the shielding layer 113 is formed of a conductive filler, the shielding layer 113 can be formed by applying a solvent containing a conductive filler to the surface of the concealing layer 112, and drying the solvent. The conductive filler may be a metal filler, metal-coated resin filler, carbon filler, or a mixture thereof. The metal filler may be copper powder, silver powder, nickel powder, silver-coated copper powder, gold-coated copper powder, silver-coated nickel powder, gold-coated nickel powder, or the like. These metal powders can be produced by electrolysis, atomization, reduction, or the like. The shape of the metal powder may be spherical, flake-shaped, fibrous, dendrite-shaped, or the like.

In this embodiment, the thickness of the shielding layer 113 may be suitably selected, depending on the desired electromagnetic wave shielding effect and repeated bending/sliding resistance.

The affixation film 101 preferably has a total luminous transmittance of 20% or less, more preferably 10% or less, and even more preferably 5% or less. If the total luminous transmittance is 20% or less, then when the affixation film 101 is affixed to the printed wiring board 102, the circuit pattern 122 is less likely to be directly visually recognized. In order to provide the affixation film 101 having a total luminous transmittance of 20% or less, a coloring agent, conductive filler, or the like may be added to the concealing layer 112 and/or the adhesive layer 111. In the case where the shielding layer 113 made of metal foil or the like is provided, the total luminous transmittance is substantially zero. Note that the total luminous transmittance can be measured in accordance with JIS K 7136.

EXAMPLES

The affixation film will now be described in greater detail by way of examples. Examples described below are only for illustrative purposes, and are in no way intended to limit the present invention.

<Fabrication of Releasable Base>

Fine dry ice particles were blown to a surface of a polyethylene terephthalate film (hereinafter referred to as a "PET film") having a thickness of 25 μm to form irregularities at the surface. Thereafter, a release layer made of a melamine resin was provided on the surface to obtain a releasable base 1.

A matte layer composition containing silica particles, a melamine resin, and toluene was prepared, and applied to a surface of a polyethylene terephthalate film having a thickness of 25 μm using a wire bar, followed by heat drying, to obtain a releasable base 2 having a matte layer having a thickness of 5 μm. By changing the particle size and added amount of the silica particles, releasable bases 3-7 having different surface states were similarly obtained. The surface textures of the surfaces (on which a concealing layer is to be formed) of the releasable bases 1-7 are shown together in Table 1.

TABLE 1

| | | Releasable bases | | | | | | |
|---|---|---|---|---|---|---|---|---|
| | | 1 | 2 | 3 | 4 | 5 | 6 | 7 |
| Surface textures | Rku | 2.6 | 2.9 | 3.0 | 2.3 | 2.3 | 2.4 | 3.1 |
| | Sku | 2.0 | 2.1 | 2.3 | 1.8 | 1.8 | 1.8 | 4.2 |
| | Rmr (%) | 7.7 | 5.6 | 5.8 | 8.8 | 10.1 | 9.5 | 5.1 |
| | Vmc (mL/m$^2$) | 2.8 | 2.9 | 2.5 | 3.5 | 3.5 | 3.2 | 1.7 |
| | Ra (μm) | 1.9 | 1.7 | 1.3 | 1.8 | 1.8 | 1.9 | 0.7 |
| | Sa (μm) | 2.5 | 2.8 | 2.3 | 3.0 | 2.8 | 2.7 | 1.8 |
| | Sv (μm) | −9.4 | −11.3 | −10.3 | −12.5 | −9.8 | −10.9 | −13.3 |
| | Sz (μm) | 19.1 | 22.7 | 19.8 | 17.1 | 20.0 | 18.3 | 18.4 |

<Fabrication of Concealing Layer>

A concealing layer composition was prepared by adding, to toluene, 100 parts by mass of a bisphenol A type epoxy resin (jER1256, manufactured by Mitsubishi Chemical Corporation), 0.1 parts by mass of a curing agent (ST14, manufactured by Mitsubishi Chemical Corporation), and 15 parts by mass of carbon particles (TOKABLACK #8300/F, manufactured by Tokai Carbon Co., Ltd.) as a black coloring agent, where the solid content amount thereof was 20 mass %. The composition thus obtained was applied to a surface of a releasable base using a wire bar, followed by heat drying, to produce a concealing layer having a thickness of 5 μm on the surface of the releasable base.

<Fabrication of Adhesive Layer>

An adhesive layer composition was prepared by adding, to toluene, 100 parts by mass of a bisphenol A type epoxy resin (jER1256, manufactured by Mitsubishi Chemical Corporation) and 0.1 parts by mass of a curing agent (ST14, manufactured by Mitsubishi Chemical Corporation), where the solid content amount thereof was 20 mass %, followed by stirring and mixing. The adhesive layer composition thus obtained was applied to a PET film (hereinafter referred to as a "support film") whose surface had been subjected to a mold release treatment, using a wire bar, followed by heat drying, to form an adhesive layer having a thickness of 5 μm on the surface of the support film.

<Fabrication of Affixation Film>

The concealing layer formed on the surface of the releasable base and the adhesive layer formed on the surface of the support film were attached together, followed by heating and pressurization at a pressure of 5 MPa using a pair of metal rollers heated to 100° C., to obtain an affixation film. The affixation film thus obtained had a total luminous transmittance of 5% or less.

<Fabrication of Substrate for Assessment>

The affixation film thus obtained was affixed to a printed wiring board using a press machine at a temperature of 170° C. and a pressure of 2-3 MPa for 3 minutes. Thereafter, the releasable base was removed. Thus, a substrate for assessment was prepared.

Figure 3:
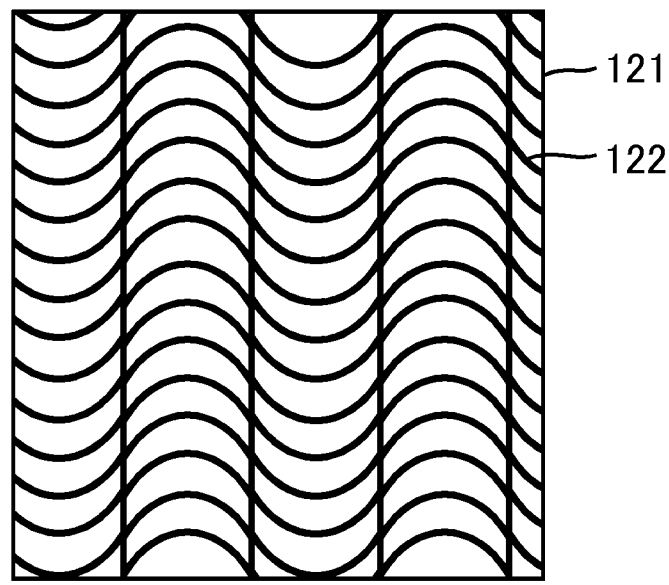
FIG. 3 is a plan view showing a test substrate used in examples.

The printed wiring board was such that the circuit pattern 122 shown in FIG. 3 was formed on the base layer 121 made of a polyimide film. The circuit pattern 122 was formed of copper foil having a line width of 0.1 mm and a height of 12 μm. An adhesive layer having a thickness of 25 μm, and a coverlay (insulating film) made of a polyimide film and having a thickness of 12.5 μm, were provided on the base layer 121, covering the circuit pattern 122.

<Assessment of Surface State>

Measurement was performed on the surface at five predetermined points using a confocal microscope (OPTELICS HYBRID, manufactured by Lasertec Corporation, objective lens: 20×) in accordance with JIS B0601: 2001. Thereafter, inclination correction was performed using a data analysis application (LMeye7), and Rku, Rmr, and Ra were determined. In addition, measurement was performed on the surface at five predetermined points in accordance with ISO 25178. Thereafter, inclination correction was performed using a data analysis application (LMeye7), and Sku, Vmc, Sa, Sv, and Sz were determined. Note that the cut-off wavelength of an S-filter was 0.0025 mm, and the cut-off wavelength of an L-filter was 0.8 mm. Each numeral value was the average of values measured at the five points.

<Assessment of Concealing Properties>

The substrates for assessment were placed on a flat table surface. It was assessed whether or not the circuit pattern was visually recognized from the concealing layer at a height of 30 cm from the substrate for assessment and at an angle of 45 degrees in an environment in which the illuminance of the surface of the shielded wiring substrate was 500 lux. When the circuit pattern was not visually recognized, the concealment was assessed as being good (open circle). When the circuit pattern was not visually recognized, the concealment was assessed as not being good (cross).

Example 1

An affixation film was produced using a concealing layer formed using the releasable base 1 to obtain a substrate for assessment. After removal of the releasable base, the surface of the concealing layer of the substrate for assessment had an Rku of 2.6 and an Sku of 2.0. The surface had an Rmr of 7.7%, wherein the cut level was 20%. The surface had a Vmc of 2.8 mL/m², where the areal material ratio at which the protruding hills are separated from the core was 10%, and the areal material ratio at which the protruding dales are separated from the core was 80%. The surface also had an Ra, Sa, Sv, and Sz of 1.8 μm, 2.3 μm, −10.2 μm, and 18.3 μm, respectively. The circuit pattern was not visually recognized in visual inspection, and therefore, the concealment was considerably good.

Example 2

A substrate for assessment was prepared in a manner similar to that of Example 1, except that the releasable base 2 was used. After removal of the releasable base, the surface of the concealing layer of the substrate for assessment had an Rku of 2.9 and an Sku of 2.1. The surface had an Rmr of 5.6% and a Vmc of 2.9 mL/m². The surface also had an Ra, Sa, Sv, and Sz of 1.8 μm, 2.5 μm, −12.9 μm, and 23.6 μm, respectively. The circuit pattern was not visually recognized in visual inspection, and therefore, the concealment was considerably good.

Example 3

A substrate for assessment was prepared in a manner similar to that of Example 1, except that the releasable base 3 was used. After removal of the releasable base, the surface of the concealing layer of the substrate for assessment had an Rku of 3.0 and an Sku of 2.3. The surface had an Rmr of 5.8% and a Vmc of 2.5 mL/m². The surface also had an Ra, Sa, Sv, and Sz of 1.0 μm, 2.0 μm, −9.8 μm, and 18.2 μm, respectively. The circuit pattern was not visually recognized in visual inspection, and therefore, the concealment was considerably good.

Comparative Example 1

A substrate for assessment was prepared in a manner similar to that of Example 1, except that the releasable base 4 was used. After removal of the releasable base, the surface of the concealing layer of the substrate for assessment had an Rku of 2.3 and an Sku of 1.8. The surface had an Rmr of 8.8% and a Vmc of 3.5 mL/m². The surface also had an Ra, Sa, Sv, and Sz of 2.0 μm, 2.7 μm, −11.5 μm, and 18.8 μm, respectively. The circuit pattern was visually recognized in visual inspection, and therefore, the concealment was not good.

Comparative Example 2

A substrate for assessment was prepared in a manner similar to that of Example 1, except that the releasable base 5 was used. After removal of the releasable base, the surface of the concealing layer of the substrate for assessment had an Rku of 2.3 and an Sku of 1.8. The surface had an Rmr of 10.1% and a Vmc of 3.5 mL/m². The surface also had an Ra, Sa, Sv, and Sz of 1.7 µm, 2.7 µm, −10.9 µm, and 18.4 µm, respectively. The circuit pattern was visually recognized in visual inspection, and therefore, the concealment was not good.

Comparative Example 3

A substrate for assessment was prepared in a manner similar to that of Example 1, except that the releasable base 6 was used. After removal of the releasable base, the surface of the concealing layer of the substrate for assessment had an Rku of 2.4 and an Sku of 1.8. The surface had an Rmr of 9.5% and a Vmc of 3.2 mL/m². The surface also had an Ra, Sa, Sv, and Sz of 1.9 µm, 2.6 µm, −10.0 µm, and 16.9 µm, respectively. The circuit pattern was visually recognized in visual inspection, and therefore, the concealment was not good.

Comparative Example 4

A substrate for assessment was prepared in a manner similar to that of Example 1, except that the releasable base 7 was used. After removal of the releasable base, the surface of the concealing layer of the substrate for assessment had an Rku of 3.1 and an Sku of 4.2. The surface had an Rmr of 5.1% and a Vmc of 1.7 mL/m². The surface also had an Ra, Sa, Sv, and Sz of 0.7 µm, 1.5 µm, −11.1 µm, and 16.2 µm, respectively. The circuit pattern was visually recognized in visual inspection, and therefore, the concealment was not good.

Table 2 show the results of the examples and comparative examples together.

TABLE 2

| | | Examples | | | Comparative Examples | | | |
|---|---|---|---|---|---|---|---|---|
| | | 1 | 2 | 3 | 1 | 2 | 3 | 4 |
| Surface textures | Rku | 2.6 | 2.9 | 3.0 | 2.3 | 2.3 | 2.4 | 3.1 |
| | Sku | 2.0 | 2.1 | 2.3 | 1.8 | 1.8 | 1.8 | 4.2 |
| | Rmr (%) | 7.7 | 5.6 | 5.8 | 8.8 | 10.1 | 9.5 | 5.1 |
| | Vmc (mL/m²) | 2.8 | 2.9 | 2.5 | 3.5 | 3.5 | 3.2 | 1.7 |
| | Ra (µm) | 1.8 | 1.8 | 1.0 | 2.0 | 1.7 | 1.9 | 0.7 |
| | Sa (µm) | 2.3 | 2.5 | 2.0 | 2.7 | 2.7 | 2.6 | 1.5 |
| | Sv (µm) | −10.2 | −12.9 | −9.8 | −11.5 | −10.9 | −10.0 | −11.1 |
| | Sz (µm) | 18.3 | 23.6 | 18.2 | 18.8 | 18.4 | 16.9 | 16.2 |
| Concealment | | ○ | ○ | ○ | x | x | x | x |

INDUSTRIAL APPLICABILITY

The affixation film for a printed wiring board according to the present disclosure provides a high level of concealment of a circuit pattern, and therefore, is useful as an affixation film for concealing a circuit pattern, electromagnetic wave shielding film, etc.

DESCRIPTION OF REFERENCE CHARACTERS

101 AFFIXATION FILM
102 PRINTED WIRING BOARD
111 ADHESIVE LAYER
112 CONCEALING LAYER
113 SHIELDING LAYER
121 BASE LAYER
122 CIRCUIT PATTERN
123 ADHESIVE LAYER
124 INSULATING FILM

The invention claimed is:

1. An affixation film for a printed wiring board, comprising:
    a circuit pattern concealing layer; and
    an adhesive layer put on top of the circuit pattern concealing layer,
    wherein an opposite surface of the circuit pattern concealing layer from the adhesive layer has an Rku of 2.5-3.0.

2. The affixation film of claim 1, wherein the opposite surface of the circuit pattern concealing layer from the adhesive layer has an Rmr of 5.3-8.5%, where a cut level is 20%.

3. An electromagnetic wave shielding film, comprising:
    the affixation film of claim 1,
    wherein the adhesive layer is a conductive adhesive layer.

4. The electromagnetic wave shielding film of claim 3, further comprising:
    a shielding layer between the circuit pattern concealing layer and the adhesive layer.

5. An affixation film for a printed wiring board, comprising:
    a circuit pattern concealing layer; and
    an adhesive layer put on top of the circuit pattern concealing layer,
    wherein an opposite surface of the circuit pattern concealing layer from the adhesive layer has an Sku of 1.8-4.0, and
    wherein the opposite surface of the circuit pattern concealing layer from the adhesive layer has a Vmc of 2.0-3.0 mL/m², where an areal material ratio at which protruding hills are separated from a core is 10%, and an areal material ratio at which protruding dales are separated from a core is 80%.

6. An electromagnetic wave shielding film, comprising:
    the affixation film of claim 5,
    wherein the adhesive layer is a conductive adhesive layer.

7. The electromagnetic wave shielding film of claim 6, further comprising:
    a shielding layer between the circuit pattern concealing layer and the adhesive layer.

* * * * *